United States Patent [19]
Huijser

[11] Patent Number: 5,903,189
[45] Date of Patent: May 11, 1999

[54] HIGH GAIN LOW DISTORTION BRIDGE AMPLIFIER WITH FEEDBACK

[75] Inventor: Jan P. F. Huijser, Nijmegen, Netherlands

[73] Assignee: U.S. Philips Corporation, New York, N.Y.

[21] Appl. No.: 08/870,062

[22] Filed: Jun. 5, 1997

[30] Foreign Application Priority Data

Jun. 21, 1996 [EP] European Pat. Off. .............. 96201726

[51] Int. Cl.$^6$ ....................................................... H03F 3/68
[52] U.S. Cl. ............................................. 330/146; 330/84
[58] Field of Search ....................... 330/69, 84, 124 R, 330/146, 149

[56] References Cited

U.S. PATENT DOCUMENTS

| | | | |
|---|---|---|---|
| 4,446,442 | 5/1984 | Yokoyama | 330/149 |
| 4,560,946 | 12/1985 | Yokoyama | 330/149 |
| 4,721,919 | 1/1988 | LaRosa et al. | 330/146 |
| 4,758,796 | 7/1988 | Verhoeven et al. | 330/84 |
| 4,922,207 | 5/1990 | Botti | 330/84 |
| 5,191,297 | 3/1993 | Penman et al. | 330/146 |

OTHER PUBLICATIONS

Data Handbook IC01B "Semiconductors for Radio and Audio Systems", p. 1247, 1995 of Philips Semiconductors.

*Primary Examiner*—Steven Mottola
*Attorney, Agent, or Firm*—Steven S. Rubin

[57] ABSTRACT

A bridge amplifier circuit comprising two amplifiers in bridge configuration having a feedback path from the output of one of the amplifiers to the reference input of the other amplifier, together with compensation means for reducing the voltage variation at the reference input. In this way offset and distortion are reduced, although the gain of the amplifier circuit is not affected by the presence of the feedback path.

15 Claims, 1 Drawing Sheet

HIGH GAIN LOW DISTORTION BRIDGE AMPLIFIER WITH FEEDBACK

BACKGROUND OF THE INVENTION

1. Field of the Invention

The invention relates to a bridge amplifier circuit comprising a first and a second amplifier, each having a signal input, a reference input and an output, for supplying an amplified input signal to a load coupled between the outputs.

2. Description of Related Art

Such an amplifier circuit is known from the Data Handbook IC01b "Semiconductors for Radio and Audio Systems", p. 1247, 1995 of Philips Semiconductors. In a bridge configuration this amplifier circuit, the TDA1516, is used for driving a load coupled between the outputs of the two amplifiers. A drawback of the known bridge amplifier circuit is that Offsets can occur between the outputs of the two amplifiers, which causes a DC current to flow through the load. This in its turn results in unnecessary power consumption.

SUMMARY OF THE INVENTION

An object of the invention is to provide a bridge amplifier circuit with reduced offset at the outputs.

A bridge amplifier circuit according to the invention is characterized in that a feedback path is provided from the output of the first amplifier to the reference input of the second amplifier and that compensation means are provided for reducing signal variations at the reference input of the second amplifier. The invention is based on the recognition that by providing a compensation of signal variations at the reference input of the second amplifier, a feedback path can be provided from the output of the first amplifier to said reference input for reducing an offset voltage between the two outputs. In this way the advantage of the feedback path (i.e. reduction of offset voltages) are maintained without having the usual drawback of a feedback path, namely a reduced gain of the amplifier circuit. An additional advantage of the present invention is that only signal variations are compensated for. This means that distortion components present in the output signal of the first amplifier are also present at said reference input and consequently at the output of the second amplifier as well. Now these distortion components are present in common mode at both sides of the load, which means that the distortion components in the signal current flowing through the load will be significantly reduced.

An embodiment of the bridge amplifier circuit according to the invention is characterized in that the feedback path comprises an impedance and the compensation means comprise a current source having a current value proportional to the input signal. This is a simple implementation of the measures according to the invention. The insertion of an impedance in the feedback path allows the use of a simple input-signal-dependent current source to be coupled to the reference input for reducing the signal variation at this input. By making this current proportional to the input signal, any errors/distortion or offset in the output signal of the first amplifier, but which are not present in the input signal IN, will not be reduced at the reference input. This results in a compensation thereof due to their presence at both sides of the load.

An embodiment of the bridge amplifier circuit according to the invention is characterized in that the product of impedance value and current value are chosen so as to provide a voltage at the reference input of the second amplifier for substantially compensating a signal voltage supplied to said reference input by the output of the first amplifier. The signal current applied to the reference input together with the feedback impedance result in a voltage at the reference input substantially equal to the product of the resistance value and the signal current value. By choosing the value of this product substantially equal to the output voltage of the second amplifier but opposed in sign, this output voltage is substantially compensated at the reference input, thereby maximizing the gain of the circuit. An additional advantage of this compensation is that the reference input now only has to deal with a voltage having only small variations and not a voltage which can have a large range. This simplifies the input circuitry of the first amplifier significantly.

An embodiment of the amplifier circuit according to the invention is characterized in that the gain of the first amplifier is higher than the gain of the second amplifier. By providing the amplifier with a higher gain than the second first amplifier, the first amplifier will be driven to high output voltages sooner than the second amplifier and will therefore be the amplifier having the highest distortion. Due to the presence of the feedback path, this distortion will not be present in the signal current flowing through the load, as the feedback path ensures that a distortion component present in the output voltage of the first amplifier will also be present in the output voltage of the second amplifier. Thus this distortion is present at both ends of the load and will therefore not be present in the current through the load. Through these measures the bridge amplifier circuit can be driven to generate slightly more output power with less distortion than possible in a bridge amplifier circuit, wherein the gains of both amplifiers are equal (or wherein the gain of the second amplifier is higher than the gain of the first amplifier).

BRIEF DESCRIPTION OF THE DRAWINGS

The above object and features of the present invention will be more apparent from the following description of the preferred embodiments with reference to the drawings, wherein.

DESCRIPTION OF THE PREFERRED EMBODIMENTS

Figure 1:
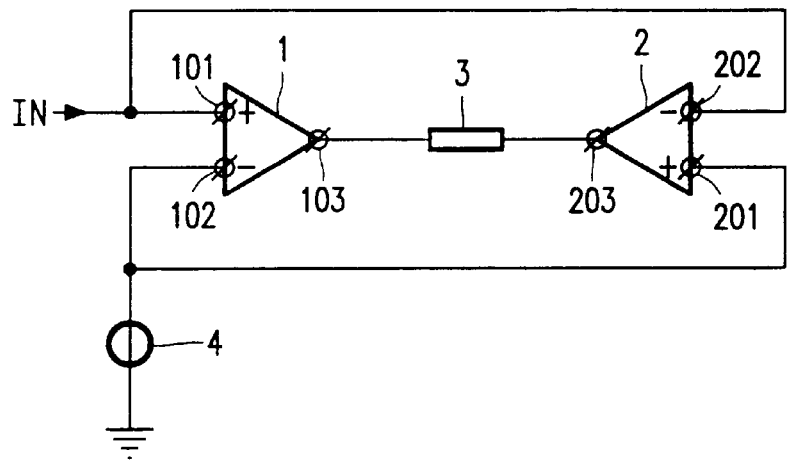
FIG. 1 shows a diagram of a known bridge amplifier circuit.

FIG. 1 shows a diagram of a known bridge amplifier circuit. The bridge amplifier circuit comprises a first amplifier 1 having a non-inverting signal input 101, an inverting reference input 102 and an output 103, a second amplifier 2 having an inverting signal input 202, a non-inverting reference input 201 and an output 203, a load 3 and a reference voltage source 4. The reference inputs 102 and 201 are coupled to the reference voltage source 4. The signal inputs 101 and 202 are mutually coupled for receiving an input signal IN. The input signal IN is amplified by the first and second amplifiers 1 and 2, which operate in a bridge configuration for achieving a high gain. The load 3 is coupled between the outputs 103 and 203. Although each amplifier receives the same reference voltage, it is still possible that an offset voltage is present between the outputs 103 and 203, due to, for example, mismatches between the two amplifiers.

Figure 2:
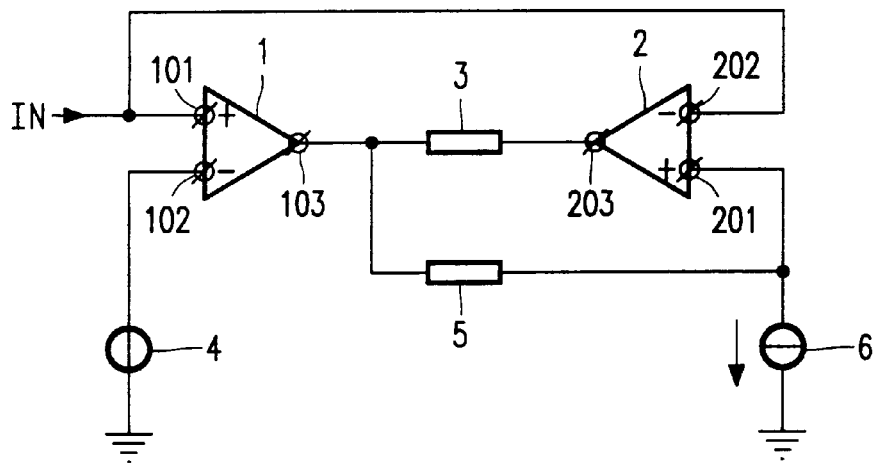
FIG. 2 shows a diagram of a first embodiment of a bridge amplifier circuit according to the invention.

FIG. 2 shows a diagram of a first embodiment of a bridge amplifier circuit according to the invention. FIG. 2 differs from FIG. 1 in the following respects:

the reference input 201 of the second amplifier 2 is no longer coupled to the reference voltage source 4 or the reference input 102 of the first amplifier 1, an impedance 5 is coupled between the output 103 of the first amplifier 1 and the reference input 201 of the second amplifier 2, and a signal current source 6 is coupled to the reference input 201 of the second amplifier 2. The current value of the signal current source 6 is proportional to the input signal. The sign of the current supplied by signal current source 6 is such that it generates a signal voltage at the reference input 201 of the second amplifier 2, proportional in magnitude but opposite in sign or polarity to a signal voltage supplied by the output 103 of the first amplifier 1 via the impedance 5. In this way the signal current source 6 acts as compensation means for reducing signal variations at said reference input 201. Preferably the product of the impedance value of impedance 5 and the current value of signal current source 6 is chosen so as to substantially compensate said signal voltage supplied by the first amplifier 1. Now only distortion components and offset voltage present in the output signal of the first amplifier 1 are fed back to the reference input 201 of the second amplifier 2. This means that these undesired components are now present at both sides of load 3 and, consequently, substantially no current related to these undesired components will flow through the load 5. As the signal variations at the reference input 201 are effectively compensated, no feedback is present for signal variations. In this way the usual drawback of feedback, i.e. reduced gain is no longer present, and the gain of the bridge amplifier circuit is substantially the same as the gain of the known bridge amplifier circuit without feedback. An additional advantage of the present invention is that the input circuit of the second amplifier 2 can be kept simple, as the input circuit does not have to deal with large voltage variations, for example, voltage variations extending from the positive supply voltage to the negative supply voltage generated in response to a large input signal IN. In a preferred embodiment the gain of the first amplifier 1 is at least slightly higher than the gain of the second amplifier 2. At large input signal levels this means that it is possible that the output voltage of the second amplifier 2 comprises hardly any distortion, whereas the output signal of the first amplifier 1 comprise some (or even a lot of) distortion due to the higher gain of the first amplifier 1. Due to the feedback this distortion is fed back to the other end of the load and no distortion will be present in the current through the load 3. If the gains of both amplifiers were the same, and in this situation and the previous situation the sum of the gains of the amplifiers are the same, it may be so that both output signals comprise some distortion, of which only the distortion in the output signal of the second amplifier 2 is compensated due to the feedback. Thus, even though the total gain is not changed, less distortion will be present in the signal through load 3 when the gain of the first amplifier 1 is at least slightly higher than the gain of the second amplifier 2. Thus it is possible to obtain a higher overall gain with reduced distortion compared to a circuit wherein the gain of the second amplifier 2 is equal to or greater than the gain of the first amplifier 1.

Figure 3:
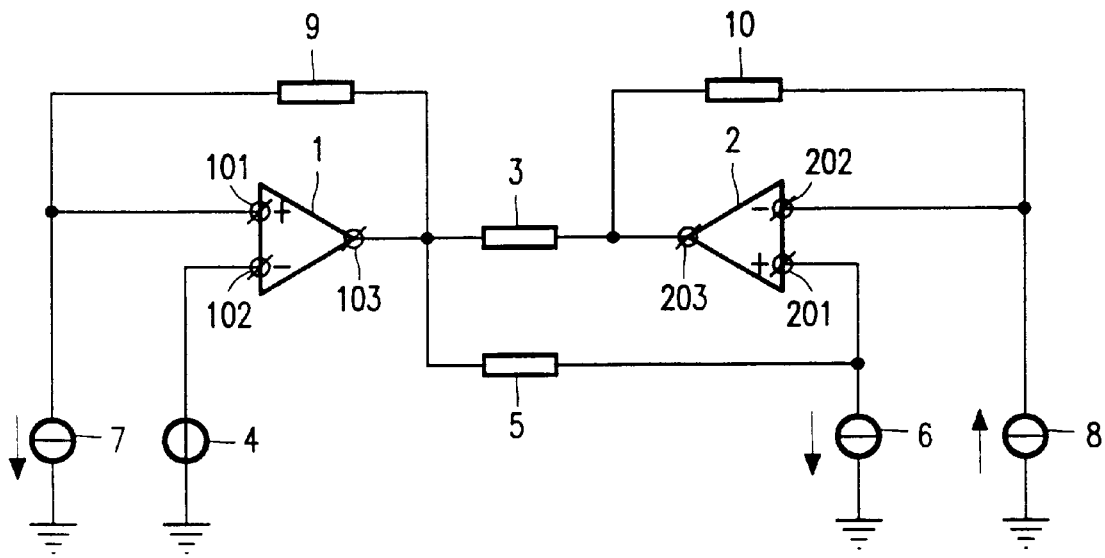
FIG. 3 shows a diagram of a second embodiment of a bridge amplifier circuit according to the invention. In the figures, identical parts are provided with the same reference numbers.

FIG. 3 shows a diagram of a second embodiment of an amplifier circuit according to the invention. The first and second amplifiers 1, 2 are configured as operational amplifiers, each having respective feedback impedances 9 and 10, coupled between the respective outputs 103 and 203, and the respective non-inverting and inverting signal inputs 101 and 202. Signal current sources 7 and 8 are coupled to the signal inputs 101 and 202, respectively, for providing signal currents to the respective signal inputs, the current values being proportional to the input signal but having mutually opposite signs. Signal current sources 6 and 7 have the same signs. Now the reference inputs 102 and 201 are each non-inverting inputs. The product of impedance value of impedance 5 and current value of signal current source 6 should preferably be substantially equal to the product of impedance value of impedance 9 and current value of signal current source 7. The product of impedance value of impedance 10 and current value of signal current source 8 should preferably be lower than the other previously mentioned products for realising a lower signal gain at output 203 than at output 103 for reducing distortion.

The invention is not restricted to the examples given above. For instance, the signs of the inputs may all be reversed, as long as the two amplifiers have gains with mutually opposite signs. The reference voltage source 4 may be implemented in many ways, as this is not a part of the present invention. Furthermore, the impedance 5 need not be a resistor, but can also be a coil or a combination of elements, as long as it provides a finite impedance for DC and provides together with the compensation means (at least), a compensation of the output voltage of the first amplifier 1 at the reference input 201 of the second amplifier 2. Impedances 9 and 10 may each be replaced with appropriate impedance networks for providing any desired transfer function for the first and second amplifiers 1 and 2. Impedance 5 may also be replaced with an appropriate impedance network for providing a desired feedback characteristic, as long as a finite impedance is provided for DC to reduce any offset.

I claim:

1. A bridge amplifier circuit comprising: a first and a second amplifier, each having a signal input, a reference input and an output, for supplying an amplified input signal to a load coupled between the outputs, characterized in that a feedback path is present from the output of the first amplifier to the reference input of the second amplifier and that compensation means are coupled to said reference input of the second amplifier for reducing signal variations caused by an output signal of the first amplifier at the reference input of the second amplifier.

2. A bridge amplifier circuit comprising: a first and a second amplifier, each having a signal inputs, a reference input and an output, for supplying an amplified input signal to a load coupled between the outputs, a feedback path between the output of the first amplifier and the reference input of the second amplifier, compensation means for reducing signal variations at the reference input of the second amplifier, and the feedback path comprises an impedance and the compensation means comprise a current source having a current value proportional to the input signal.

3. The bridge amplifier circuit of claim 2, wherein the product of impedance value of the impedance and current value of the current source are chosen so as to provide a voltage at the reference input of the second amplifier for substantially compensating a signal voltage supplied to said reference input by the output of the first amplifier.

4. The bridge amplifier circuit of claim 1, wherein the gain of the first amplifier is higher than the gain of the second amplifier.

5. The bridge amplifier circuit of claim 2, wherein the gain of the first amplifier is higher than the gain of the second amplifier.

6. The bridge amplifier circuit of claim 3, wherein the gain of the first amplifier is higher than the gain of the second amplifier.

7. The bridge amplifier circuit as claimed in claim 1 wherein the gain of the first amplifier and the gain of the second amplifier have mutually opposite polarity.

8. The bridge amplifier circuit as claimed in claim 1 wherein said first and second amplifiers each comprise an operational amplifier with a respective feedback resistor, and further comprising;

a reference voltage source coupled to the reference input of the first amplifier, and first and second signal current sources coupled to the signal inputs of the first and second amplifiers, respectively, wherein the feedback path includes an impedance and the compensation means comprise a further current source coupled to the reference input of the second amplifier.

9. The bridge amplifier circuit as claimed in claim 8 wherein the first and second signal current sources are proportional to the input signal but of mutually opposite polarity, and the first signal current source has the same polarity as the further current source.

10. The bridge amplifier circuit as claimed in claim 8 wherein the product of the feedback path impedance and the current of the further current source is substantially equal to the product of the impedance value of the feedback resistor of the first operational amplifier and the current of the first signal current source.

11. The bridge amplifier circuit as claimed in claim 10 wherein the product of the impedance value of the feedback resistor of the second operational amplifier and the current of the second signal current source is less than the product of the impedance value of the feedback resistor of the first operational amplifier and the current value of the first signal current source.

12. A bridge amplifier circuit comprising:

a first and a second amplifier, each having a signal input, a reference input and an output, for supplying an amplified input signal to a load coupled between the outputs of the first and second amplifiers, a feedback path coupled between the output of the first amplifier and the reference input of the second amplifier, and compensation means coupled to the reference input of the second amplifier for deriving a signal voltage at the reference input of the second amplifier proportional in magnitude but opposite in polarity to a signal voltage supplied by the output of the first amplifier thereby to reduce signal variations at the reference input of the second amplifier.

13. The bridge amplifier circuit as claimed in claim 12 wherein the reference input of the first amplifier is coupled to a source of reference voltage, and the compensation means comprise a current source supplying a current proportional to an input signal applied to the signal input of at least one of said first and second amplifiers.

14. The bridge amplifier circuit as claimed in claim 12 wherein the feedback path comprises an impedance and the compensation means comprise a current source coupled between the reference input of the second amplifier and a point of reference voltage, and the product of the impedance value of the feedback path impedance and the current supplied by the current source produce a voltage at the reference input of the second amplifier which compensates a signal voltage supplied to said second amplifier reference input by the output of the first amplifier and via said feedback path.

15. The bridge amplifier circuit as claimed in claim 13 wherein the gain of the first amplifier is higher than the gain of the second amplifier.

* * * * *

UNITED STATES PATENT AND TRADEMARK OFFICE
CERTIFICATE OF CORRECTION

PATENT NO. : 5,903,189

DATED : May 11, 1999

INVENTOR(S) : Jan P. F. Huijser

It is certified that error appears in the above-identified patent and that said Letters Patent is hereby corrected as shown below:

Column 1, line 32, after "amplifier." insert new paragraph.

Column 1, line 38, change "are" to --is--.

Signed and Sealed this

Twelfth Day of October, 1999

Q. TODD DICKINSON

Attest:

Attesting Officer

Acting Commissioner of Patents and Trademarks